United States Patent [19]
Arvidsson et al.

[11] Patent Number: 5,545,843
[45] Date of Patent: Aug. 13, 1996

[54] CONTACT SPRING

[75] Inventors: Stig A. Arvidsson, Tyresö ; Bo U. E. Henningsson, Nynäshamn, both of Sweden

[73] Assignee: Telefonaktiebolaget LM Ericsson, Stockholm, Sweden

[21] Appl. No.: 417,011

[22] Filed: Apr. 5, 1995

[30] Foreign Application Priority Data

Apr. 11, 1994 [SE] Sweden .................................. 9401202

[51] Int. Cl.$^6$ ...................................................... H05K 9/00
[52] U.S. Cl. .................... 174/35 GC; 174/35 R; 361/816
[58] Field of Search ............................ 174/35 R, 35 GC; 361/638, 649, 769, 787, 800, 816, 818; 257/659; 49/483.1, 490.1, 495.1, 496.1; 439/608, 609; 24/293, 294, 295

[56] References Cited

U.S. PATENT DOCUMENTS

| | | | |
|---|---|---|---|
| 3,904,810 | 9/1975 | Kraus | 174/35 MS |
| 4,260,849 | 4/1981 | Kirby | 174/51 |
| 4,710,590 | 12/1987 | Endahl | 174/35 GC |
| 4,761,516 | 8/1988 | Reichert | 174/35 GC |
| 4,762,966 | 8/1988 | Uosanda | 174/35 GC |
| 4,803,306 | 2/1989 | Malmquist | 174/35 GC |
| 4,879,434 | 11/1989 | Assel et al. | 174/35 R |
| 4,889,959 | 12/1989 | Taylor et al. | 174/35 GC |
| 4,890,199 | 12/1989 | Beutler | 174/35 R X |
| 4,952,752 | 8/1990 | Roun | 174/35 R |
| 5,015,802 | 5/1991 | Chi | 174/35 GC |
| 5,029,254 | 7/1991 | Stickney | 174/35 GC |
| 5,083,239 | 1/1992 | Sedlemeier et al. | 174/35 GC |
| 5,099,396 | 3/1992 | Barz et al. | 174/35 R X |
| 5,233,507 | 8/1993 | Günther et al. | 174/35 R X |
| 5,261,826 | 11/1993 | Leeb et al. | 439/67 |
| 5,329,066 | 7/1994 | Hansson | 174/35 R X |
| 5,383,098 | 1/1995 | Ma et al. | 361/818 |

FOREIGN PATENT DOCUMENTS

| | | |
|---|---|---|
| 3716137 | 11/1988 | Germany . |
| 2226187 | 6/1990 | United Kingdom . |

Primary Examiner—Kristine L. Kincaid
Assistant Examiner—Christopher Horgan
Attorney, Agent, or Firm—Burns, Doane, Swecker & Mathis, L.L.P.

[57] ABSTRACT

A contact spring for securing a component having a flange-like edge to a substrate, for instance for securing a cooling screen or shield to a circuit board, includes an elongated profiled part that is generally U-shaped in cross section for surface-mounting on the substrate. A first leg of the U-shaped profiled part is substantially straight and extends continuously along the contact spring. The second leg of the U-shaped profiled part has tongues whose upper extremities are bent inwardly towards the bottom of the profiled part. Alternate tongues on the second leg are angled to form a fork-like contact with the first leg. The other tongues on the second leg are semicircular and extend approximately half way above the bottom of the profiled part.

11 Claims, 2 Drawing Sheets

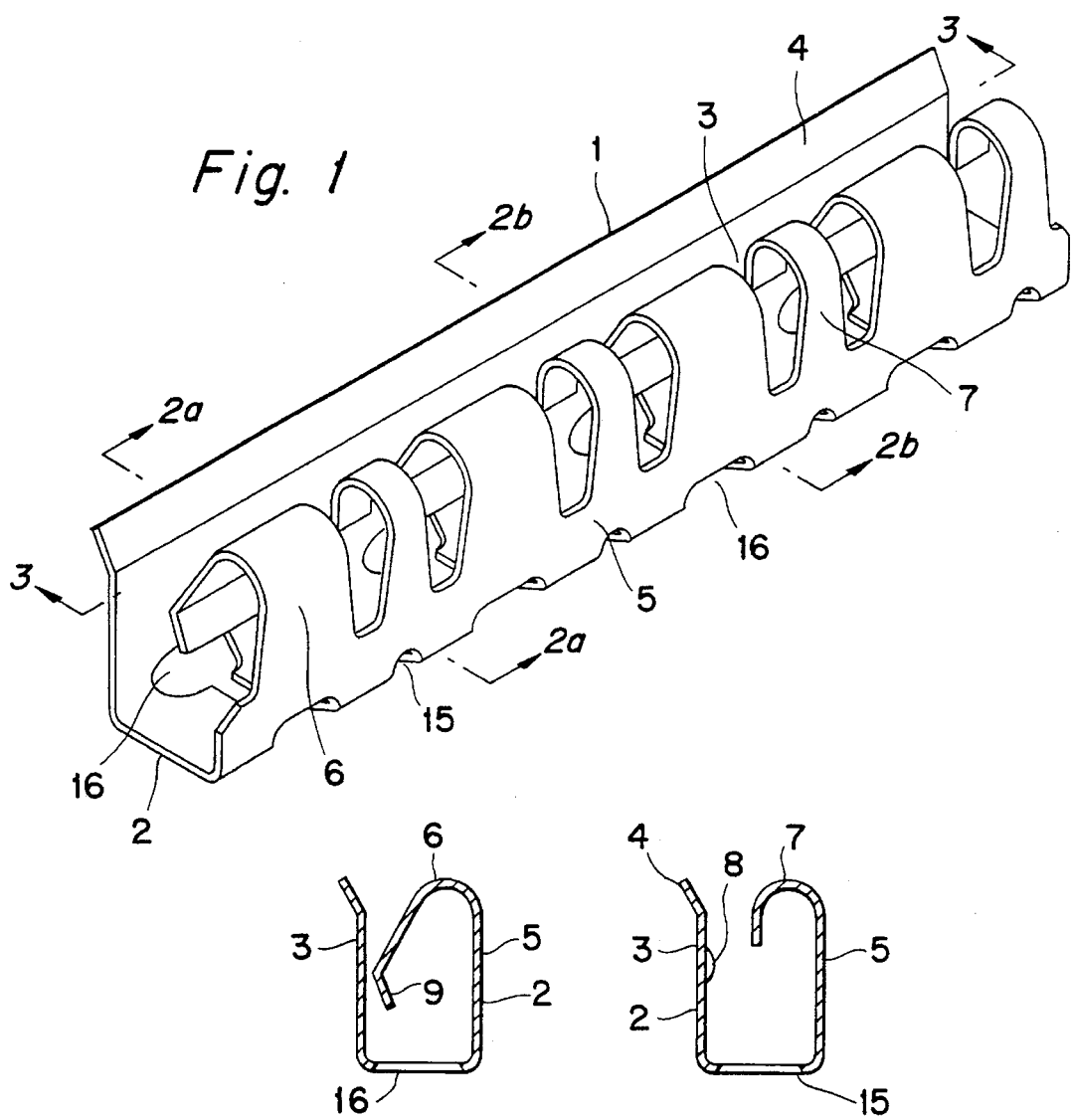
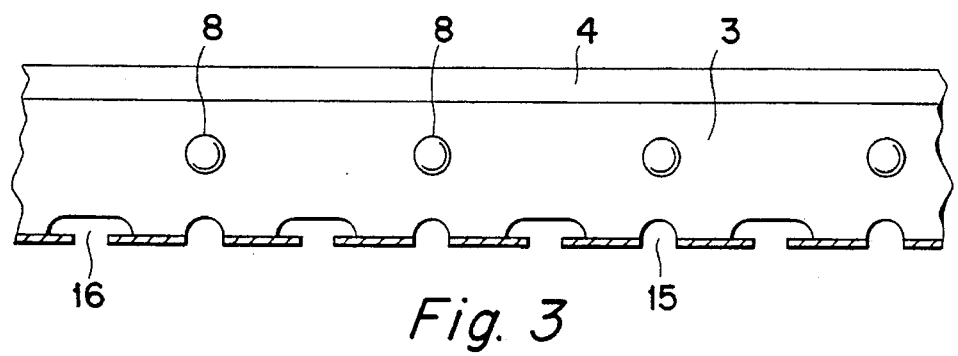

Fig. 4
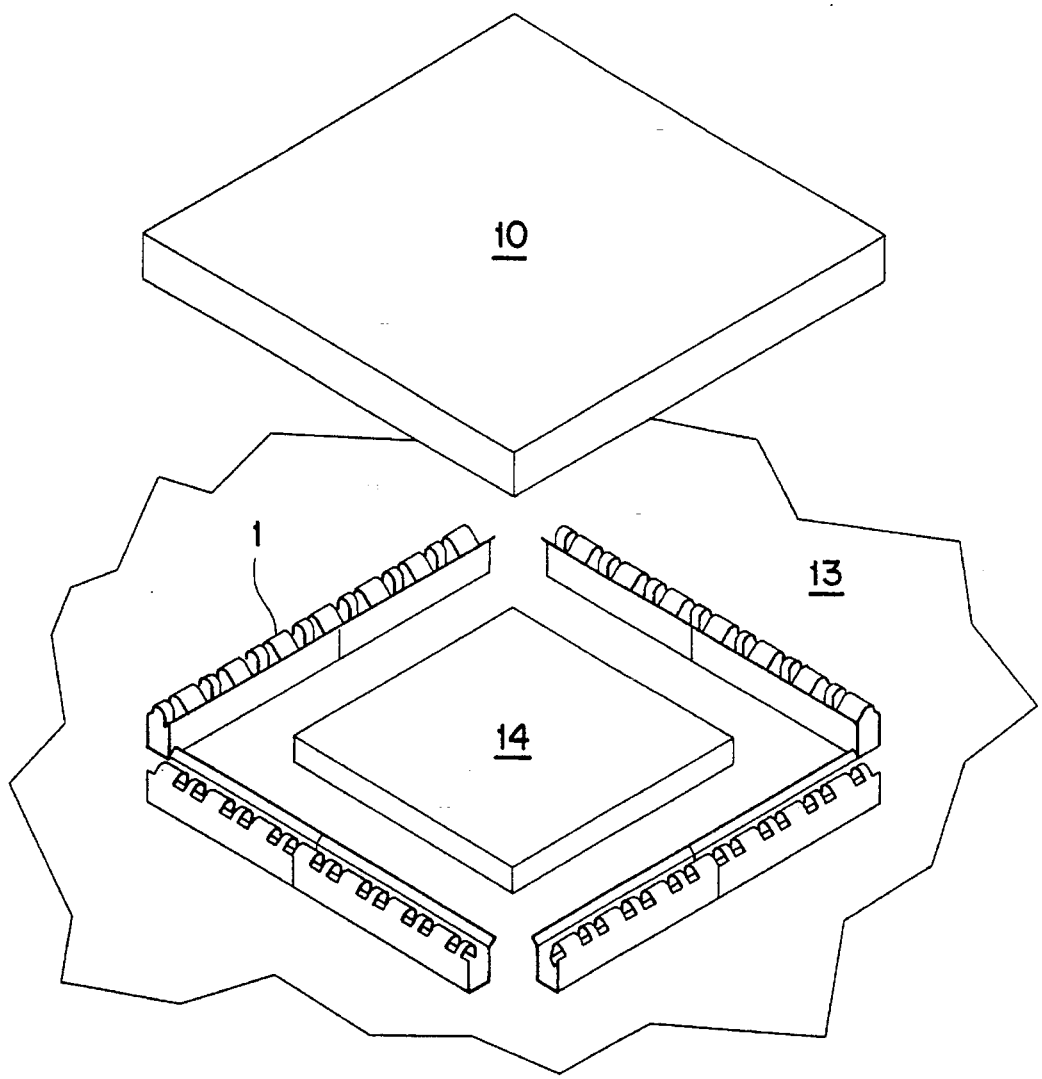
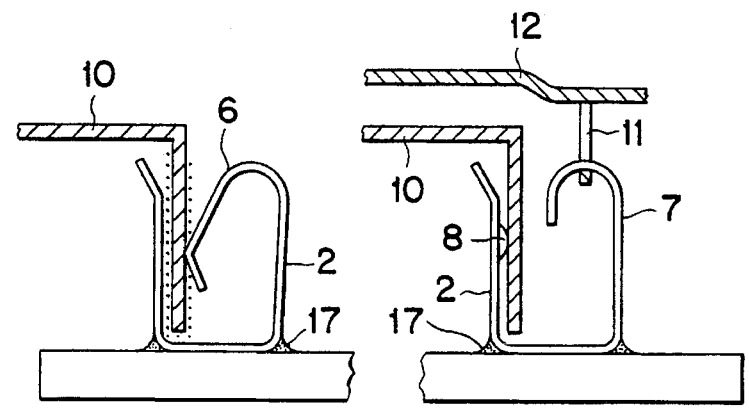
Fig. 5a  Fig. 5b

CONTACT SPRING

The present invention relates to a contact spring for surface mounting on a circuit board and which is intended primarily to establish contact between the board and a metal hood or cover. The contact spring includes an elongated part which has an essentially U-shaped section. The inventive contact spring may be used for applicating a cooling screen to a circuit board, for instance.

BACKGROUND

When shielding and/or cooling IC-components there has often been used hitherto a metal frame which is hole-mounted on a circuit board, and a metal cover or lid. However, completely different requirements are placed today on arrangements of this kind, due to the much higher frequencies that shall be attenuated or dampened, up to 5 GHz, meaning that a hole distance greater than 2 mm between shield and circuit board cannot be accepted. If such a conventional concept were to be put into effect, the circuit board would be perforated with holes, which cannot be accepted because of the reduced packaging density of conductors.

For the purpose of fitting a cooling screen or some other flange-like component on a circuit board there has been proposed a type of contact spring which is surface mounted on the board. This spring has the form of a generally U-shaped section into which the component has been placed. The drawback with this type of spring is that it does not provide sufficient contact pressure, therewith resulting in bad electric contact and impaired screening. Furthermore, this type of spring lacks the possibility of securing further components, for instance a fastener means for holding a cooler or the like firmly in place over a cooling screen attached in the contact spring.

SUMMARY

The object of the present invention is to eliminate the drawbacks of known contact springs, by providing a contact spring which will provide satisfactory contact pressure and therewith offer a safe and positive function, and which will provide effective screening and which can also be manufactured cheaply. The contact spring will also have integrated therewith a facility which enables devices for securing coolers or other elements to be fastened to a screen or the like which is pressed into the contact spring profile. This object has been achieved with a contact spring having the characteristic features set forth in the following claims.

The invention will now be described in more detail with reference to a preferred embodiment thereof and also with reference to the accompanying drawings.

BRIEF DESCRIPTION OF THE DRAWINGS

FIG. 1 is a perspective view of an inventive contact spring.

FIGS. 2a and 2b are respective cross-sectional views of the contact spring, taken on the line 2a—2a and the line 2b—2b respectively in FIG. 1.

FIG. 3 is a longitudinal section view of the contact spring, taken on the line 3—3 in FIG. 1.

FIG. 4 illustrates schematically the use of a number of contact springs in securing a cooling screen.

FIGS. 5a and 5b illustrate respectively the cooling screen fastened in the contact spring, in sections corresponding to FIGS. 2a and b.

DETAILED DESCRIPTION

FIG. 1 is a perspective view of an inventive contact spring 1. The contact spring includes a part 2 of generally U-shaped section, whose one leg 3 extends continuously along the full length of the profiled part. The upper extremity of the leg 3 is angled outwardly to provide a guide 4 for a shield, screen or the like that is to be pressed into the profiled part. The other leg 5 is provided with tongues 6 and 7, whose upper extremities are bent inwards to a generally semicircular shape, towards the first leg 3 and downwards towards the bottom of the profiled part 2.

Each alternate tongue 6 is angled towards the first leg 3, so as to form a fork-shaped contact together with said first leg, as illustrated in FIG. 2a. The tongue 6 is configured so as to obtain a large contact pressure between the contact spring 1 and an object that is pressed into the spring. In order to further ensure that good electric contact with punctiform i.e. dot or point-like shaped abutment is achieved, the first leg 3 may be provided with wart-like projections 8. Preferably, the projections 8 include a serrated or "orange-segment shaped" surface. The outermost part 9 of the tongue 6 is further angled at the abutment point, as is also shown in FIG. 2a, so as to facilitate withdrawal of the object from the profiled part. The sectioned view in FIG. 5a illustrates an object pressed into the contact spring and in contact therewith, this object being a screening hood 10 for instance.

The other tongues 7 are semi-circular in shape and extend approximately half way across the profiled part 2, as illustrated in FIG. 2b. These tongues 7 function as fastener devices for securing a cooler or other elements to a screening hood 10 or the like pressed into the profiled part of the contact spring, as shown schematically in FIG. 5b where a hook 11 or the like on a fastener arm 12 is shown inserted into and hooked firmly by a respective tongue 7.

The contact spring 1 is manufactured in suitable lengths with a standard division of preferably 15 and 20 mm. A number of such lengths can be combined to suit different shield sizes. The use of several short contact springs instead of only one long contact spring enables the contact springs to accompany flexing movements of the circuit board and also those movements that are caused by changes in temperature. This method provides a much higher degree of flexibility and therewith low tool investment costs. The material used in the manufacture of the spring may be a tin-coated stainless steel so as to obtain an effective electrical contact. Naturally, nickel-brass or some other appropriate material may be used. Although the contact is a linear contact, it can, of course, also be a punctiform contact.

An electrical contact frame is constructed by fitting contact springs 1 of appropriate lengths to a circuit board 13 around a component 14 to be shielded and/or cooled, as shown in FIG. 4. Naturally, the frame may have either a square or a rectangular shape. The contact spring 1 is soldered to the circuit board, preferably by means of an IR-soldering process. In order to prevent the contact spring from taking excessive soldering heat from the soldering points, the soldering surfaces on the board have the form of solder pads and corresponding solder pads are provided at the bottom of the profile part 2. These pads are delimited respectively by holes 15 and 16 provided in the sides and the bottom of the profile part 2. The holes 15 are located opposite the tongues 7 in the bottom of the profile part 2 and extend between the legs 3 and 5. This reduces the surface area that is soldered to the circuit board 13. The holes 15 and 16 also enable the contact spring to be bent in manufacture in a very rational manner. The aforedescribed spring construction enables an effective solder connection to be achieved on the solder pads on the circuit board, and also enables the solder joints to be inspected after soldering, as the relatively large radius between the legs and bottom of the profiled part provide a large solder wetting surface, so that the solder will creep relatively far up the legs, as illustrated at 17 in FIGS. 5a and 5b.

The illustrated embodiment of a contact spring 1 provides very effective screening or shielding properties, as a result of creating a "tubular structure" and a "labyrinth structure" in the construction, therewith increasing attenuation in the order of 30 dB. The formation of the holes 15 and 16 result in a tubular structure between the circuit board 13 and the contact spring 1, along the bottom of the profile part 2 as shown in FIGS. 2a and 2b. Furthermore, as shown by the broken line in FIG. 5a, a labyrinth structure is formed between the hood 10 and the contact spring 1. This is a very important characteristic feature of the invention.

The integration with the contact spring 1 of a fastener means for the fastener arm 12 by the formation of tongues 7 enables the number of conceptual elements to be minimized, which in turn contributes to a reduction in manufacturing costs.

It will be understood that the invention is not restricted to the aforedescribed and illustrated embodiment thereof and that modifications and changes can be made within the scope of the following claims.

What is claimed is:

1. A contact spring for securing to a substrate a component having a flange, comprising an elongated profiled part having a generally U-shaped cross section, wherein a first leg of the U-shaped profiled part is substantially straight and extends continuously along the contact spring; a second leg of the U-shape profiled part has tongues whose upper extremities are bent inwardly towards the first leg and downwardly towards the bottom of the profiled part; at least one of said tongues on the second leg is angled to form an acute angle with the first leg; and at least one other of said tongues on the second leg is semicircular and extends approximately half way above the bottom of the profiled part.

2. The contact spring of claim 1, wherein the first leg has convex projections for punctiformly abutting the component.

3. The contact spring of claim 1, wherein the bottom of the U-shaped profiled part has solder pads for soldering to the substrate, the solder pads being delimited by holes in the bottom of the U-shaped profiled part and located opposite the tongues.

4. The contact spring of claim 1, wherein the upper edge of the first leg is angled away from the second leg.

5. The contact spring of claim 1, wherein a vertex of the acute angle formed by the first leg and said at least one of said tongues on the second leg is located approximately half way up the first leg.

6. Interconnected circuit board components comprising:

a substrate;

a component having a flange;

a contact spring for securing the component having a flange to the substrate, the contact spring including an elongated profiled part having a generally U-shaped cross section, wherein a first leg of the U-shaped profiled part is substantially straight and extends continuously along both the contact spring and the component;

a second leg of the U-shape profiled part has tongues whose upper extremities are bent inwardly towards the first leg and downwardly towards the bottom of the profiled part, at least one of said tongues on the second leg is angled to form an acute angle with the first leg, and at least one of said tongues on the second leg is semicircular and extends approximately half way above the bottom of the profiled part.

7. The contact spring of claim 6, wherein the first leg has convex projections for punctiformly abutting the component.

8. The contact spring of claim 6, wherein the bottom of the U-shaped profiled part has solder pads for soldering to the substrate, the solder pads being delimited by holes in the bottom of the U-shaped profiled part and located opposite the tongues.

9. The contact spring of claim 6, wherein the upper edge of the first leg is angled away from the second leg.

10. The contact spring of claim 6, wherein a vertex of the acute angle formed by the first leg and said at least one tongue on the second leg is located approximately half way up the first leg.

11. The contact spring of claim 6, wherein the component is a cooling shield and the substrate is a circuit board.

* * * * *